United States Patent [19]

Horowitz

[11] 4,090,009

[45] May 16, 1978

[54] NOVEL SILVER COMPOSITIONS

[75] Inventor: Samuel Jacob Horowitz, Snyder, N.Y.

[73] Assignee: E. I. Du Pont de Nemours and Company, Wilmington, Del.

[21] Appl. No.: 776,720

[22] Filed: Mar. 11, 1977

[51] Int. Cl.² .............................................. H01B 1/02
[52] U.S. Cl. .................................. 428/208; 428/210; 252/514; 106/1.19
[58] Field of Search ........................... 252/514; 106/1; 428/434, 208, 210

[56] References Cited

U.S. PATENT DOCUMENTS

| | | | |
|---|---|---|---|
| 3,374,110 | 3/1968 | Miller | 252/514 X |
| 3,553,109 | 1/1971 | Hoffman | 252/521 X |
| 3,776,769 | 12/1973 | Buck et al. | 252/514 X |
| 3,838,071 | 9/1974 | Amin | 106/1 X |
| 3,896,055 | 7/1975 | Bouchard et al. | 252/514 X |
| 3,951,672 | 4/1976 | Langley et al. | 252/514 |
| 3,960,777 | 6/1976 | Coyle | 106/1 |

*Primary Examiner*—Benjamin R. Padgett
*Assistant Examiner*—E. Suzanne Parr

[57] ABSTRACT

Compositions useful for making electrical conductor patterns on a nonconductive substrate, the compositions comprising finely divided Pd/Ag and inorganic binder. The binder is free of bismuth oxide to reduce staining at conductor/resistor interfaces, and comprises certain proportions of glass, copper oxide, and pyrochlore-related oxide (lead ruthenate and/or copper bismuth ruthenate); lead oxide is optional. Despite the absence of bismuth oxide, aged adhesion is good, as is solder acceptance.

16 Claims, No Drawings

NOVEL SILVER COMPOSITIONS

BACKGROUND OF THE INVENTION

This invention relates to electronics, and more particularly to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in "Handbook of Materials and Processes for Electronics", C. A. Harper, Editor, McGraw-Hill, N.Y., 1970, Chapter 12.

The most commonly used conductor compositions employ noble metals, especially gold, silver, platinum, palladium, and their mixtures and alloys, since their relatively inert characteristics permit firing in air. Attempts at using dispersions of less expensive non-noble metals have often been confined to specialized uses or have required the great practical inconvenience and expense of firing in non-oxidizing atmospheres (nitrogen, nitrogen/hydrogen, hydrogen, argon, etc.).

The prior art on conductor compositions includes the use of glass binders for noble metals, as well as the use of glass-free binders. Martin U.S. Pat. No. 3,293,501 discloses conductive films of glasses comprising copper and bismuth oxides. Buck U.S. Pat. No. 3,776,769 discloses compositions of noble metal, copper oxide and glass, fireable in reducing atmospheres. Short U.S. Pat. No. 2,819,170 discloses compositions of silver and a vitrifiable flux of bismuth oxide and cadmium borate.

Conductor compositions are used in the microcircuit industry to "terminate" resistor patterns, typically by firing the conductor pattern on a substrate and then printing resistor patterns over part of the conductor pattern and firing. When typical Pd/Ag conductor compositions have been used as terminations for certain ruthenium based resistors (such as low-ohm, less than 100 ohms/square/mil of thickness, resistors of pyrochlore-related oxides or $RuO_2$), staining of the surface of the conductive termination adjacent to the resistor often occurs during resistor firing.

Such surface stains are undesirable since they prevent complete soldering of the conductor in the region of the resistor. $Bi_2O_3$ is present in typical conductor compositions to enhance adhesion, but it seems to be responsible for such staining. Elimination of $Bi_2O_3$ from the compositions results in degradation of solder acceptance and adhesion of the conductor patterns to an unacceptable degree. The industry needs a $Bi_2O_3$-free termination material with good adhesion and soldering characteristics.

SUMMARY OF THE INVENTION

I have invented silver conductor compositions useful for forming highly adherent conductive films on ceramic dielectric substrates, said compositions having reduced tendency toward staining. The compositions comprise finely divided inorganic powder dispersed in an inert liquid vehicle. The inorganic powder comprises, by weight 1. 75-91% metal powder of Ag and Pd (powder mixtures and/or coprecipitated alloys) wherein the weight ratio of Ag/Pd is in the range 2/1 to 15/1, and
2. 9-25% inorganic binder of
   a. 2-6 parts bismuth-free glass,
   b. 2-9 parts copper oxide,
   c. 2-9 parts polynary oxide, and
   d. 0-6 parts lead oxide.

The polynary oxide has a pyrochlore-related crystal structure and a formula selected from the class consisting of $Pb_2Ru_2O_6$ and $Cu_xM_{2-x}M_2'O_{7-z}$ wherein i. M is Bi or a mixture of at least one-half Bi plus up to one-half of one or more cations from among
   A. bivalent Cd or Pb and
   B. trivalent Y, Tl, In and rare earth metals of atomic number 57-71, inclusive;
ii. M' is at least one of
   A. Ru,
   B. Ir, and
   C. a mixture of at least three-fourths of at least one of Ru and Ir and up to one-fourth of at least one of Pt, Ti and Rh;
iii. $x$ is in the range 0.10 to 0.60, and
iv. $z$ is in the range 0.10 to 1.0, and is equivalent to the sum of monovalent cations Cu and half of divalent cations in the polynary oxide.

Resistor compositions comprising such oxides are well known. For example, resistor compositions comprising $Pb_2Ru_2O_6$ are disclosed in Bouchard U.S. Pat. No. 3,681,262, and compositions of copper bismuth ruthenate are disclosed in Bouchard and Rogers U.S. Pat. No. 3,896,055; each of these patents is incorporated by reference herein.

Preferred compositions comprise 80-87% metal powder and 13-20% binder. The preferred Ag/Pd ratio is 4/1 to 11.5/1. Preferred binders contain no lead oxide and comprise 2-4 parts glass,
3-6 parts copper oxide, and
3-6 parts polynary oxide.

The preferred copper oxide is $Cu_2O$, the preferred lead oxide is PbO although, e.g., CuO and $Pb_3O_4$ can be used. The preferred polynary oxides are copper bismuth ruthenates, and the optimum polynary oxide has the approximate formula $Cu_{0.5}Bi_{1.5}Ru_2O_{6.5}$. Preferred compositions have 60-90% inorganic powder and 10-40% inert liquid screen-printing vehicle.

Also a part of this invention are dielectric substrates on which the silver compositions of this invention have been printed and fired to drive off the vehicle and sinter the inorganic powder into an electrically and physically continuous coating adherent to the substrate. The compositions can produce fired and soldered conductors of excellent adhesion (e.g., 3-4 lb. or 1.4-1.8 kg. force), after thermal aging (usually 48 hr. at 150° C.).

These compositions can be used as terminations for resistors (especially low-ohm resistors of ruthenium), or for any microcircuit conductor use.

DETAILED DESCRIPTION OF THE INVENTION

The compositions of the present invention comprise finely divided inorganic particles dispersed in an inert liquid medium or vehicle. The term "finely divided" will be understood by those skilled in the "thick film" art to mean particles sufficiently fine to pass through a 400-mesh screen (U.S. standard sieve scale). It is preferred that substantially all the particles have a largest dimension in the range 0.001–15 microns, the largest dimension more preferably being no longer than 5 microns.

Preferred silver particles include the commercially available "polished" silver flake particles and precipitated powder, each having a largest dimension in the range 0.1–15 microns. Small amounts of Pt and/or Au particles may be present as may other materials that do not affect the beneficial characteristics of this invention.

Pd/Ag coprecipitated alloys, as is known in the art, may be formed by reductive precipitation from solutions containing salts of two or more metals. The proportions of the metals in the solution are those desired in the coprecipitate powder. The reductants include any of those which are capable of simultaneously coprecipitating the desired metals from solution. For Pd/Ag alloys such reductants include hydrazine sulfate, sodium borohydride, amine boranes, etc. Coprecipitation techniques are, for example, described in Hoffman U.S. Pat. No. 3,390,981 and Short U.S. Pat. No. 3,620,714, each of which is incorporated by reference herein.

The inorganic binder is of the essence of the present invention. At least about 9% by weight binder (based on total inorganics) is present to produce an acceptable level of adhesion. No more than about 25% binder to permit good conductivity and good solder acceptance.

The inorganic binder of this invention, as indicated above, comprises a glass phase and at least two crystalline materials. The glass phase is a bismuth-free glass. The specific compositions of the glass is not critical, so long as bismuth oxide is absent. Preferred glasses are lead silicates, especially lead calcium aluminoborosilicates; zinc borosilicates; and lead zinc borosilicates; etc. The crystalline phase includes copper oxide ($Cu_2O$ and/or $CuO$) and the polynary oxides discussed above. Lead oxide (preferably PbO) is optional.

The inorganic particles are mixed with an inert liquid vehicle by mechanical mixing (e.g., on a roll mill) to form a paste-like composition. The latter is printed as "thick film" on conventional dielectric substrates in the conventional manner. Any inert liquid may be used as the vehicle. Any of the various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to solids in the dispersions may vary considerably and depends upon the manner in which the dispersion is to be applied and the kind of vehicle used. Normally to achieve good coverage the dispersions will contain, complementally, 60–90% solids and 10–40% vehicle. The compositions of the present invention may, of course, be modified by the addition of other materials which do not affect its beneficial characteristics.

After drying to remove the vehicle, firing of the compositions of the present invention is carried out at temperatures and for times sufficient to sinter the inorganic materials and to produce conductor patterns adherent to the dielectric substrate. The duration and peak temperature of firing are selected interdependently, longer duration permitting lower temperatures, so long as sintering occurs. Generally firing will be conducted in the range 750°–930° C., for 5–30 min. at peak, preferably 830°–875° C., more preferably 850° C., for 8–10 min. at peak.

EXAMPLES

The following examples and comparative showings are presented to illustrate the invention. In the examples and elsewhere in the specification and claims all parts, percentages, and ratios are by weight, unless otherwise stated. All firings were in air.

All of the inorganic materials used in these experiments had an average particle size in the range 1–10 microns, with substantially no particles larger than 15 microns. The aproximate surface areas of the materials used were:

| Material | Surface Area ($m^2/g.$) |
| --- | --- |
| $Cu_{0.5}Bi_{1.5}Ru_2O_{6.5}$ | 11–13 |
| $Pb_2Ru_2O_6$ | 11.5–14.5 |
| Pd | 7–11 |
| Ag | 0.95–1.65 |
| $Bi_2O_3$ | 0.24–1.3 |
| PbO | 0.37 |
| Glasses | 2.5 |
| $PbF_2$ | 3.3 |
| $Cu_2O$ | 1.5–3.0 |
| $CuAlO_2$ | 2.0–4.0 |

The vehicle was 13 parts ethyl cellulose, 44 parts terpineol and 43 parts dibutyl carbitol. The glasses used below were:

| Glass Constituent | Weight % | |
| --- | --- | --- |
| | Glass A | Glass B |
| PbO | 43.5 | 10.9 |
| CaO | 9.8 | 1.4 |
| $Al_2O_3$ | 4.3 | 0.7 |
| $B_2O_3$ | 4.9 | 0.7 |
| $SiO_2$ | 37.5 | 9.6 |
| $Bi_2O_3$ | — | 76.7 |

After the inorganic solids and vehicle were thoroughly mixed by conventional roll milling techniques, the resultant dispersion was printed on a prefired alumina substrate through a patterned 200-mesh screen having nine 80-mil (2-mm) openings aligned in a 3 by 3 matrix. The print was dried at about 150° C. to form a dry print about 1.0 mil (0.025 mm) thick. The dried print was heated in a conventional belt furnace over a 45–60 min. heating cycle, with about 8–10 min. at a peak temperature of 850° C., unless otherwise indicated in the Table (if there was a second firing, that also is indicated in the Table). The fired print had a thickness of about 0.6 mil (0.015 mm). Three or four substrates were printed with each composition, giving 9–12 data points.

Adhesion was tested as follows. Wire leads were attached to the fired conductor pads by placing a 20-gauge pretinned copper wire across three of the fired metallization pads and then dipping them in a solder pot (62Sn/36Pb/2Ag or 63Sn/37Pb as indicated in the Table) at a temperature between 220° 1 C. and 250° C., as indicated in the Table. Bond strengths were then measured by pulling the soldered leads at 90° to the substrate with an Instron tester. Several pads were pulled for each sample to obtain a representative bond strength. When "kg" is referred to, "kilograms force" is intended.

"Aged" adhesion was determined after the fired product had been thermally aged at 150° C. for 44-64 hr.

Solder acceptance of the fired patterns was tested by first applying flux (Alpha 611, a mildly activated acid flux) to the fired parts, dipping the fluxed part for 10 sec. in the solder bath at the temperature indicated in the table, and observing the amount of soldering. "Good" solder wetting means complete solder wetting with no voids; "fair" solder wetting showed only a few voids or unwet areas.

Example 1 of this invention is compared with Showing A and Showing B, neither of which are of this invention. Showing A lacks $Bi_2O_3$ and polynary oxide, and gives poor aged adhesion. Showing B lacks polynary oxide, but includes $Bi_2O_3$ to promote adhesion. Adhesion is good in Showing B, but staining occurs with this $Bi_2O_3$ composition.

In Example 2 and Showing C a higher Ag/Pd ratio (11.5/1) is used than in Example 1 (6/1). The composition of this invention (Example 2) produced better adhesion than did the $Bi_2O_3$-containing composition of Showing C, both after a single firing and after four firings at 850° C.

Examples 3, 4 and 5 show that PbO, although useful in this invention, is not essential (see Example 4), and that increased glass content degrades solder acceptance.

Examples 6-10 and Showings E-F show various proportions of PbO/$Cu_2O$/polynary oxide. Excessive conductor staining occurred when a high bismuthate glass is used (Showing F), but no polynary oxide, whereas only slight staining occurred with Examples 8, 9 and 10 of this invention (staining was not determined in Example 6, but is expected in Showing E).

Staining was determined as follows: on a prefired alumina substrate, the conductor composition of the Examples and Showings was printed and fired in a manner to that reported above. Resistor compositions were printed and fired using a composition of 46 parts $Bi_2Ru_2O_7$, 25 parts binder (65% PbO, 34% $SiO_2$, 1% $Al_2O_3$), 21 parts vehicle (10% ethyl cellulose, 45% dibutyl phosphate and 45% terpineol) and 3 parts $RuO_2 \cdot 3H_2O$. After firing, staining was observed as a dark region on the conductor pattern (termination) adjacent to the resistor overlap. The substrate was dipped into molten solder (62Sn/36Pb/2Ag, 225° C.) for 10 sec., and wetting in the region of the stain was poor.

In Example 11 and Showing G, a composition of this invention (without PbO, Example 11) was compared with a conductor composition not of this invention, employing $Bi_2O_3$ in the binder (Showing G). Solder acceptance was reduced in Showing G. Excessive staining was observed with Showing G, but no staining occurred in Example 11 (the staining test was that of Examples 8-10).

Examples 12-16 illustrate the use of various Ag/Pd ratios of this invention (4/1 to 10/1) and the absence of PbO. Resistance of the fired pattern to leaching during dipping in molten solder was determined by dipping the fired parts into a 62Sn/36Pb/2Ag bath (230° C.) using a mildly active flux (Alpha 611). Each cycle included dipping in flux, dipping in solder for 10 sec., and washing off flux residue. The fired parts of Examples 14 and 16 withstood six cycles, those of Examples 12, 13 and 15 more than four cycles and less than six cycles.

In Example 17 and Showing H and I the importance of $Cu_2O$ in these compositions is illustrated. Showing H merely omits the $Cu_2O$ of Example 17 with inferior results (adhesion and solder acceptance). Showing I replaces the $Cu_2O$ of Example 17 with 4.5 parts pyrochlore, with results similar to those of Showing H.

Table

| Components/Properties | Example (No.) or Showing (Letter) | | | | | | | |
|---|---|---|---|---|---|---|---|---|
| | A | 1 | B | C | 2 | 3 | 4 | 5 |
| Inorganic Solids (wt. %) | | | | | | | | |
| Ag | 58.9 | 57.1 | 58.3 | 63 | 63 | 58.3 | 58.3 | 58.3 |
| Pd | 9.8 | 9.5 | 9.7 | 5.5 | 5.5 | 9.7 | 9.7 | 9.7 |
| Glass A | 3.0 | 2.9 | 3.0 | 2.3 | 3.0 | 3.0 | 3.0 | 5.0 |
| $Cu_2O$ | 4.5 | 4.4 | — | — | 4.5 | 4.5 | 4.5 | 4.5 |
| PbO | 4.5 | 4.4 | — | — | 4.5 | 2.25 | — | — |
| $Cu_{0.5}Bi_{1.5}Ru_2O_{6.5}$ | — | 3.0 | — | — | 4.5 | 4.5 | 4.5 | 4.5 |
| $CuAlO_2$ | — | — | 1.0 | — | — | — | — | — |
| $Bi_2O_3$ | — | — | 9.0 | 5.6 | — | — | — | — |
| Total | 80.7 | 81.3 | 81.0 | 77.4 | 85.0 | 82.55 | 80 | 82 |
| Ag/Pd wt. ratio | 6/1 | 6/1 | 6/1 | 11.5/1 | 11.5/1 | 6/1 | 6/1 | 6/1 |
| Vehicle (wt. %) | 19.3 | 18.7 | 19.0 | 23.6 | 15.0 | 17.45 | 20 | 18 |
| Aged Adhesion, 62Sn/36Pb/2Ag, 220-225° C. | | | | | | | | |
| lb. | 1.7 | 4.8 | 3.5 | 2.2* | 5.1** | 5.9 | 5.1 | 3.1 |
| kg. | 0.8 | 2.2 | 1.6 | 1.0 | 2.3 | 2.7 | 2.3 | 1.4 |
| Solder Acceptance, 62Sn/36Pb/2Ag, 220° C.*** | G-E | G-E | G-E | G | G-E | G | G | P-F |

| | 6 | 7 | 8 | 9 | 10 | E | F | 11 | G |
|---|---|---|---|---|---|---|---|---|---|
| Inorganic Solids (wt. %) | | | | | | | | | |
| Ag | 58.3 | 58.3 | 58.3 | 58.3 | 58.3 | 58.3 | 45 | 60.9 | 58.3 |
| Pd | 9.7 | 9.7 | 9.7 | 9.7 | 9.7 | 9.7 | 18 | 10.1 | 9.7 |
| Glass A | 3.0 | 6.0 | 3.0 | 3.0 | 3.0 | 3.0 | — | 3.0 | 3.0 |
| Glass B | — | — | — | — | — | — | 16 | — | — |
| $Cu_2O$ | 4.5 | 4.5 | 4.5 | 6.0 | 4.5 | — | — | 4.5 | — |
| PbO | 4.5 | 4.5 | 6.0 | 4.5 | 4.5 | — | — | — | — |
| $Cu_{0.5}Bi_{1.5}Ru_2O_{6.5}$ | 3.0 | 3.0 | 3.0 | 3.0 | 4.5 | — | — | 4.5 | — |
| $CuAlO_2$ | — | — | — | — | — | 1.0 | — | — | 1.0 |
| $Bi_2O_3$ | — | — | — | — | — | 9.0 | — | — | 9.0 |
| Total | 83 | 86 | 84.5 | 84.5 | 84.5 | 81 | 79 | 83 | 81 |
| Ag/Pd wt. ratio | 6/1 | 6/1 | 6/1 | 6/1 | 6/1 | 6/1 | 2.5/1 | 6/1 | 6/1 |
| Vehicle (wt. %) | 17 | 14 | 15.5 | 15.5 | 15.5 | 19 | 21 | 17 | 19 |
| Aged Adhesion, 62Sn/36Pb/2Ag, 220° C. | | | | | | | | | |
| lb. | 4.9 | 5.7 | 4.9 | 5.9 | 5.8 | 5.4 | 4.8 | 4.8 | 4.9 |

Table-continued

| | | | | | | | | | |
|---|---|---|---|---|---|---|---|---|---|
| kg. | 2.2 | 2.6 | 2.2 | 2.7 | 2.6 | 2.5 | 2.2 | 2.2 | 2.2 |
| Solder Acceptance, 62Sn/36Pb/2Ag, 220° C. | N.D. | N.D. | N.D. | N.D. | N.D. | N.D. | N.D. | G-E | F-G |

| | 12 | 13 | 14 | 15 | 16 | 17 | H | I | 18 |
|---|---|---|---|---|---|---|---|---|---|
| Inorganic Solids (wt. %) | | | | | | | | | |
| Ag | 52.0 | 55.0 | 61.6 | 64.0 | 60.9 | 60.9 | 60.9 | 60.9 | 58.3 |
| Pd | 13.0 | 11.0 | 8.8 | 6.4 | 10.1 | 10.1 | 10.1 | 10.1 | 9.7 |
| Glass A | 3.0 | 3.0 | 3.0 | 3.0 | 3.0 | 3.0 | 3.0 | 3.0 | 3.0 |
| $Cu_2O$ | 4.5 | 4.5 | 4.5 | 4.5 | 4.5 | 4.5 | — | — | 4.5 |
| PbO | — | — | — | — | — | — | — | — | 4.5 |
| $Cu_{0.5}Bi_{1.5}Ru_2O_{6.5}$ | 4.5 | 4.5 | 4.5 | 4.5 | 4.5 | 4.5 | 4.5 | 9.0 | — |
| $Pb_2Ru_2O_6$ | — | — | — | — | — | — | — | — | 4.5 |
| Total | 87.0 | 88.0 | 82.4 | 82.4 | 83.0 | 83.0 | 78.5 | 83.0 | 84.5 |
| Ag/Pd wt. ratio | 4/1 | 5/1 | 7/1 | 10/1 | 6/1 | 6/1 | 6/1 | 6/1 | 6/1 |
| Vehicle (wt. %) | 23.0 | 22.0 | 17.6 | 17.6 | 17.0 | 17 | 21.5 | 17 | 15.5 |
| Aged Adhesion, 62Sn/36Pb/2Ag, 220° C. | | | | | | | | | |
| lb. | 6.4 | 6.1 | 5.7 | 5.6 | 6.1 | — | — | — | 5.2 |
| kg. | 2.9 | 2.8 | 2.6 | 2.5 | 2.8 | — | — | — | 2.4 |
| Aged Adhesion, 63Sn/37Pb, 250° C. | | | | | | | | | |
| lb. | — | — | — | — | — | 5.0 | 3.5 | 3.4 | — |
| kg. | — | — | — | — | — | 2.3 | 1.6 | 1.5 | — |
| Solder Acceptance, 63Sn/37Pb, 240° C. | — | — | — | — | — | G | F-G | F-G | — |
| 62Sn/36Pb/2Ag, 220° C. | — | — | — | — | — | — | — | — | G |

*After four firings, 2.2 lb. (1 kg.)
**After four firings, 4.5 lb. (2 kg.)
***E is excellent, G good, F fair and P poor.

I claim:

1. Silver conductor compositions useful for forming highly adherent conductive films on ceramic dielectric substrates, said compositions having reduced tendency to stain the surface of the substrate, said compositions comprising finely divided inorganic powder dispersed in an inert liquid vehicle, wherein said inorganic powder comprises, by weight,
   1. 75-91% metal powder of Ag and Pd wherein the weight ratio of Ag/Pd is in the range 2/1 to 15/1, and
   2. 9-25% inorganic binder of,
      a. 2-6 parts bismuth-free glass,
      b. 2-9 parts copper oxide,
      c. 2-9 parts polynary oxide, and
      d. 0-6 parts lead oxide said polynary oxide having a pyrochlore-related crystal structure and a formula selected from the class consisting of $Pb_2Ru_2O_6$ and $Cu_xM_{2-x}M'_2O_{7-z}$ wherein
   i. M is Bi or a mixture of at least one-half Bi plus up to one-half of one or more cations from among
      A. bivalent Cd or Pb and
      B. trivalent Y, Tl, In and rare earth metals of atomic number 57-71, inclusive;
   ii. M' is at least one of
      A. Ru
      B. Ir, and
      C. a mixture of at least three-fourths of at least one of Ru and Ir and up to one-fourth of at least one of Pt, Ti and Rh;
   iii. x is in the range 0.10 to 0.60 and
   iv. z is in the range 0.10 to 1.0, and is equivalent to the sum of monovalent cations Cu and have of divalent cations in the polynary oxide.

2. Compositions according to claim 1 wherein there are
   1. 80-87% metal powder and
   2. 13-20% inorganic binder.

3. Compositions according to claim 1 wherein the Ag/Pd ratio in (2) is in the range 4/1 to 11.5/1.

4. Compositions according to claim 2 wherein the Ag/Pd ratio in (2) is in the range 4/1 to 11.5/1.

5. Compositions according to claim 1 wherein the inorganic binder (2) comprises
   A. 2-4 parts bismuth-free glass,
   B. 3-6 parts copper oxide and
   C. 3-6 parts polynary oxide.

6. Compositions according to claim 2 wherein the inorganic binder (2) comprises
   A. 2-4 parts bismuth-free glass,
   B. 3-6 parts copper oxide and
   C. 3-6 parts polynary oxide.

7. Compositions according to claim 5 wherein the copper oxide is cuprous oxide.

8. Compositions according to claim 6 wherein the copper oxide is cuprous oxide.

9. Compositions according to claim 1 wherein the polynary oxide (2) (c) is $Pb_2Ru_2O_6$.

10. Compositions according to claim 1 wherein the polynary oxide (2) (c) is of the said formula $Cu_xM_{2-x}M'_2O_{7-z}$.

11. Compositions according to claim 10 wherein the polynary oxide (2) (c) has the approximate formula $Cu_{0.5}Bi_{1.5}Ru_2O_{6.5}$.

12. Compositions according to claim 10 of 60-90% inorganic powder and 10-40% said inert liquid vehicle.

13. A dielectric substrate bearing a sintered pattern of the composition of claim 1.

14. A dielectric substrate bearing a sintered pattern of the composition of claim 2.

15. A dielectric substrate bearing a sintered pattern of the composition of claim 9.

16. A dielectric substrate bearing a sintered pattern of the composition of claim 10.